(12) United States Patent
Jang et al.

(10) Patent No.: US 8,952,701 B2
(45) Date of Patent: Feb. 10, 2015

(54) ISOLATION RESISTANCE MEASURING APPARATUS HAVING FAULT SELF-DIAGNOSING FUNCTION AND SELF-DIAGNOSING METHOD USING THE SAME

(71) Applicant: LG Chem, Ltd., Seoul (KR)

(72) Inventors: Jin-Su Jang, Seoul (KR); Joong-Woo Lee, Daejeon (KR); Seung Won Back, Gimhae-si (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/090,719

(22) Filed: Nov. 26, 2013

(65) Prior Publication Data

US 2014/0084933 A1     Mar. 27, 2014

Related U.S. Application Data

(63) Continuation of application No. PCT/KR2013/002817, filed on Apr. 4, 2013.

(30) Foreign Application Priority Data

Apr. 4, 2012 (KR) .................. 10-2012-0034907
Apr. 4, 2013 (KR) .................. 10-2013-0036809

(51) Int. Cl.
| | | |
|---|---|---|
| *G01N 27/416* | (2006.01) | |
| *G01R 31/36* | (2006.01) | |
| *G01R 35/00* | (2006.01) | |
| *G01R 27/00* | (2006.01) | |
| *G01R 31/02* | (2006.01) | |
| *H01M 10/48* | (2006.01) | |

(52) U.S. Cl.
CPC ............ *G01R 31/3606* (2013.01); *G01R 35/00* (2013.01); *G01R 27/00* (2013.01); *G01R 31/025* (2013.01); *H01M 10/48* (2013.01)
USPC ......................................................... 324/430

(58) Field of Classification Search
USPC ......................................................... 324/430
See application file for complete search history.

(56) References Cited

U.S. PATENT DOCUMENTS

| 2005/0073320 A1* | 4/2005 | Yamamoto et al. ........... 324/557 |
| 2008/0197855 A1* | 8/2008 | Uchida .......................... 324/509 |
| 2009/0134881 A1* | 5/2009 | Tachizaki ...................... 324/551 |

FOREIGN PATENT DOCUMENTS

| JP | 2005-114497 A | 4/2005 |
| JP | 2005-127821 A | 5/2005 |
| JP | 2007-170983 A | 7/2007 |
| KR | 10-2009-0024573 A | 3/2009 |
| WO | WO 2012/036498 A2 | 3/2012 |

OTHER PUBLICATIONS

International Search Report issued in PCT/KR2013/002817, dated Jun. 26, 2013.

* cited by examiner

*Primary Examiner* — Drew A Dunn
*Assistant Examiner* — Nathaniel Pelton
(74) *Attorney, Agent, or Firm* — Birch, Stewart, Kolasch & Birch, LLP (57) ABSTRACT

Disclosed is an isolation resistance measuring apparatus having a fault self-diagnosing function. The isolation resistance measuring apparatus having a fault self-diagnosing function forms a diagnosis circuit by means of a first isolation resistance measuring unit and a second isolation resistance measuring unit respectively connected to a cathode terminal and an anode terminal of a battery, and includes a control unit for determining whether a fault arises at the isolation resistance measuring apparatus by using a circuit equation derived from the diagnosis circuit and first and second diagnosis voltages. Therefore, the isolation resistance measuring apparatus may diagnose whether a fault arises at a device which measures isolation resistance of a battery.

14 Claims, 5 Drawing Sheets

ISOLATION RESISTANCE MEASURING APPARATUS HAVING FAULT SELF-DIAGNOSING FUNCTION AND SELF-DIAGNOSING METHOD USING THE SAME

CROSS-REFERENCE TO RELATED APPLICATION

The present application is a continuation of International Application No. PCT/KR2013/002817 filed on Apr. 4, 2013, which claims priority to Korean Patent Application No. 10-2012-0034907 filed on Apr. 4, 2012, and Korean Patent Application No. 10-2013-0036809 filed on Apr. 4, 2013, in the Republic of Korea, the disclosures of which are incorporated herein by reference.

TECHNICAL FIELD

The present disclosure relates to an isolation resistance measuring apparatus having a fault self-diagnosing function and a fault self-diagnosing method using the same, and more particularly, to an apparatus and method for diagnosing a fault of a device which may measure isolation resistance of a battery adopted by a battery power supply system demanding a high voltage.

BACKGROUND ART

Recently, due to the exhaustion of fossil energy and environmental pollution, the interest in electric products, which may operate with electric energy instead of fossil energy, is growing more and more.

Accordingly, with the increasing development and consumption of mobile devices, electric vehicles, hybrid vehicles, power storage devices, uninterrupted power supplies, or the like, the consumption of secondary batteries as energy sources are rapidly increasing as well as its various forms thereof. Therefore, secondary batteries are being studied very actively to cope with such diverse demands.

In particular, a device using a high-power large-capacity battery, such as an electric vehicle or a hybrid vehicle, needs to maintain good isolation between the device and the battery. If not, bad isolation of the battery brings a leakage current, which causes various problems. For reference, a leakage current causes unexpected discharge of the battery or malfunctions of electronic components provided at the device. In addition, in case of a device using a high voltage battery, such as an electric vehicle, a leakage current may give a fatal electric shock to a person. Therefore, in order to solve problems caused by such a leakage current, various kinds of isolation resistance measuring devices for determining an isolation state of a secondary battery are being developed and used.

Meanwhile, if an isolation resistance calculated by an isolation resistance measuring device is not accurate, the advantageous effects of the device deteriorates and is not able to solve various problems caused by a leakage current. In particular, if a problem arises at a voltage detection element included in a device for measuring isolation resistance or a control element for calculating isolation resistance, it is impossible to measure an accurate isolation resistance value, and the measured isolation resistance value is untrustworthy. Therefore, there is a demand for an apparatus and method which may diagnose whether a fault arises at the isolation resistance measuring device.

DISCLOSURE

Technical Problem

The present disclosure is designed to solve the problems of the related art, and therefore the present disclosure is directed to providing an isolation resistance measuring apparatus having a fault self-diagnosing function and a fault self-diagnosing method using the same.

Technical Solution

In one aspect of the present disclosure, there is provided an isolation resistance measuring apparatus having a fault self-diagnosing function, which includes a first isolation resistance measuring unit and a second isolation resistance measuring unit respectively connected to a cathode terminal and an anode terminal of a battery; first switch and second switch for connecting the first isolation resistance measuring unit and the second isolation resistance measuring unit to the cathode terminal and the anode terminal, respectively; a voltage detection unit for sensing first and second diagnosis voltages by means of the first and second isolation resistance measuring units; and a control unit for outputting control signals to the first and second switches to form a diagnosis circuit, the control unit determining whether a fault arises at the isolation resistance measuring apparatus by using a circuit equation derived from the diagnosis circuit and the first and second diagnosis voltages received from the voltage detection unit when the diagnosis circuit is formed.

The second isolation resistance measuring unit according to the present disclosure may further include a DC power applying unit.

According to an embodiment of the present disclosure, the control unit may determine whether a fault arises at the isolation resistance measuring apparatus, by checking whether the following equation is valid when the first and second diagnosis voltages are put therein:

$$\left(\frac{V_{diag1}}{R_2}\right)R_1 + V_{diag1} + \left(\frac{V_{DC} - V_{diag2}}{R_2}\right)R_1 - V_{diag2} = V_{Bat}$$

where $V_{Bat}$ represents a battery voltage value, $V_{diag1}$ represents a first diagnosis voltage, $V_{diag2}$ represents a second diagnosis voltage, $V_{DC}$ represents a voltage value of the DC power applying unit, $R_1$ represents a first resistance value, and $R_2$ represents a second resistance value.

According to another embodiment of the present disclosure, the control unit may determine whether a fault arises, by checking whether a value calculated from the equation falls within an error range preset based on the voltage value of the battery.

Preferably, the control unit may determine that a fault arises when the value calculated from the equation is different by 1% or more based on the voltage value of the battery.

The isolation resistance measuring apparatus having a fault self-diagnosing function according to the present disclosure may further include a memory unit which stores a battery voltage value, a voltage value of the DC power applying unit, a first resistance value and a second resistance value.

The control unit according to the present disclosure may include a switch controller for controlling the first and second switches to turn on or off; an A/D converter for converting an analog voltage signal output from the voltage detection unit into a digital voltage signal; and a central processing unit for receiving the digital voltage signal from the A/D converter and determining whether a fault arises at the isolation resistance measuring apparatus.

The isolation resistance measuring apparatus having a fault self-diagnosing function according to the present disclosure may further include a transmission unit for forming a communication interface with an external device, and the control unit may transmit information about whether a fault arises at the isolation resistance measuring apparatus to the external device by means of the transmission unit. At this time, the external device may be a battery analyzing device or a control device of a system on which a battery is loaded.

The isolation resistance measuring apparatus having a fault self-diagnosing function according to the present disclosure may further include an alarming unit for outputting a visual or audio alarming signal, and the control unit may output a visual or audio alarming signal by means of the alarming unit when it is determined that a fault arises at the isolation resistance measuring apparatus.

In another aspect of the present disclosure, there is also provided a fault self-diagnosing method of an isolation resistance measuring apparatus, which connects first and second isolation resistance measuring units to cathode and anode terminals of a battery, respectively, by using a first switch and a second switch and diagnoses whether a fault arises at the isolation resistance measuring apparatus by using first and second diagnosis voltages detected by the first and second isolation resistance measuring units, the method including: (a) outputting control signals to the first switch and second switch to form a diagnosis circuit; (b) receiving first and second diagnosis voltages detected by the first and second isolation resistance measuring units; and (c) determining whether a fault arises at the isolation resistance measuring apparatus by using a circuit equation derived from the diagnosis circuit and the first and second diagnosis voltages.

The second isolation resistance measuring unit according to the present disclosure may further include a DC power applying unit.

According to one embodiment of the present disclosure, the step (c) may determine whether a fault arises at the isolation resistance measuring apparatus, by checking whether the following equation is valid when the first and second diagnosis voltages are put therein:

$$\left(\frac{V_{diag1}}{R_2}\right)R_1 + V_{diag1} + \left(\frac{V_{DC} - V_{diag2}}{R_2}\right)R_1 - V_{diag2} = V_{Bat}$$

where $V_{Bat}$ represents a battery voltage value, $V_{diag1}$ represents a first diagnosis voltage, $V_{diag2}$ represents a second diagnosis voltage, $V_{DC}$ represents a voltage value of the DC power applying unit, $R_1$ represents a first resistance value, and $R_2$ represents a second resistance value.

According to another embodiment of the present disclosure, the step (c) may determine whether a fault arises, by checking whether a value calculated from the equation falls within an error range preset based on the voltage value of the battery.

Preferably, the step (c) may determine that a fault arises when the value calculated from the equation is different by 1% or more based on the voltage value of the battery.

The fault self-diagnosing method of the isolation resistance measuring apparatus according to the present disclosure may further include: storing a battery voltage value, a voltage value of the DC power applying unit, a first resistance value and a second resistance value.

The fault self-diagnosing method of the isolation resistance measuring apparatus according to the present disclosure may further include: transmitting information about whether a fault arises at the isolation resistance measuring apparatus to an external device. In this case, the fault self-diagnosing method of the isolation resistance measuring apparatus according to the present disclosure may further include: outputting a visual or audio alarming signal to a user when it is determined in the step (c) that a fault arises at the isolation resistance measuring apparatus.

Advantageous Effects

According to an aspect of the present disclosure, it is possible to diagnose whether a fault arises at an isolation resistance measuring apparatus of a battery.

According to another aspect of the present disclosure, it is possible to diagnose a fault by using an original configuration, namely without adding any further component to the isolation resistance measuring apparatus of a battery.

According to another aspect of the present disclosure, it is possible to notify the fault occurrence to a user or an external device, which enables the user to take necessary measures.

DESCRIPTION OF DRAWINGS

The accompanying drawings illustrate preferred embodiments of the present disclosure and, together with the foregoing disclosure, serve to provide further understanding of the technical spirit of the present disclosure. However, the present disclosure is not to be construed as being limited to the drawings in which.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

FIG. 1 is a circuit diagram schematically showing an equivalent circuit of an isolation resistance measuring apparatus 100 having a fault self-diagnosing function and a battery power supply system according to an embodiment of the present disclosure.

Figure 1:
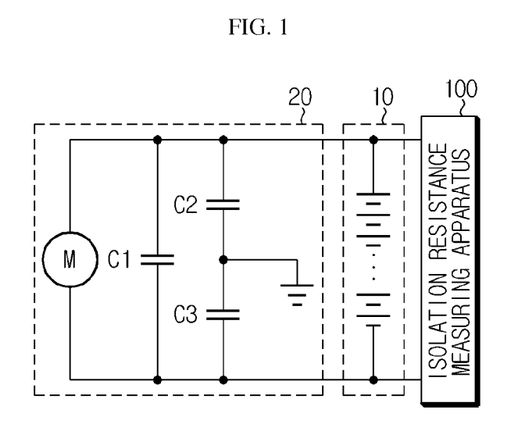
FIG. 1 is a circuit diagram schematically showing an equivalent circuit of an isolation resistance measuring apparatus having a fault self-diagnosing function and a battery power supply system according to an embodiment of the present disclosure.

As shown in FIG. 1, in a battery power supply system including a battery 10 in which a plurality of cells are connected in series or in parallel to form a cell assembly and a load 20 for receiving power output from the battery 10, the isolation resistance measuring apparatus 100 having a fault self-diagnosing function according to the present disclosure is connected between cathode and anode terminals of the battery 10.

The battery 10 is an electric energy storage unit and includes a plurality of rechargeable unit cells to be electrically connected. The unit cell is an electric double layer capacitor including an ultra capacitor or a secondary battery such as a lithium ion battery, a lithium polymer battery, a nickel cadmium battery, a nickel hydrogen battery and a nickel zinc battery. For example, in the case the battery 10 is a battery used in an electric vehicle or a hybrid vehicle, the battery 10 outputs high voltage DC power over 200V. However, the present disclosure is not limited to the battery kind, output power, charge capacity or the like.

The load 20 may be configured with a motor M of an electric vehicle or a hybrid vehicle, a DC to DC converter (noise) or the like. In addition, the load 20 may include a DC/DC cap C1 and Y-caps C2, C3 in order to remove noise generated at the motor M. The DC/DC cap C1 adopts a capacitor with a large capacity to remove high frequency noise generated at the motor M, and the Y-caps C2, C3 remove low frequency noise generated at the motor M.

The isolation resistance measuring apparatus 100 having a fault self-diagnosing function according to the present disclosure is connected between cathode and anode terminals of the battery 10 and measures isolation resistance of the battery 10. Prior to explaining the fault self-diagnosing algorithm of the isolation resistance measuring apparatus 100 having a fault self-diagnosing function according to the present disclosure, an isolation resistance measuring algorithm will be described in brief with reference to FIG. 2.

Figure 2:
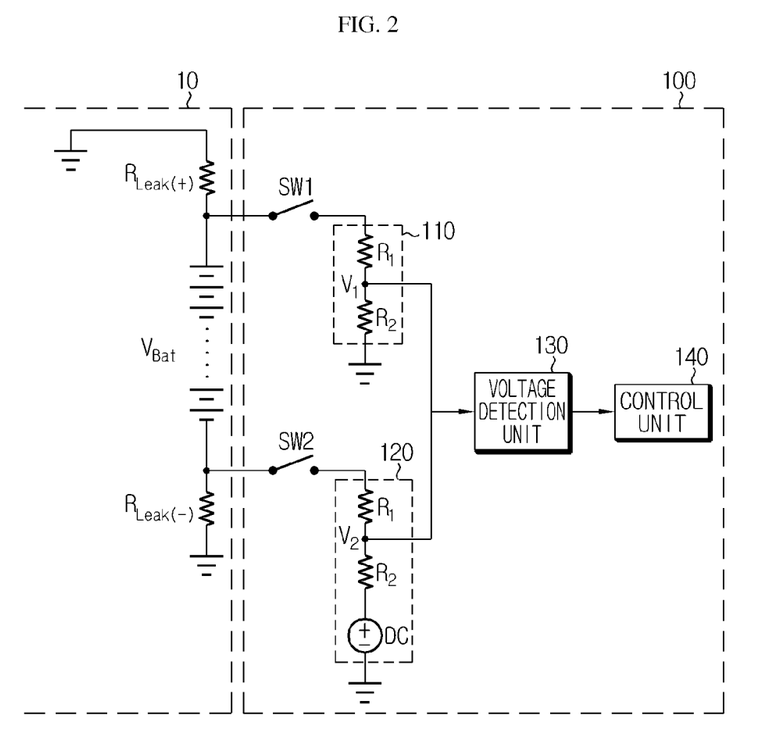
FIG. 2 is a circuit diagram schematically showing an equivalent circuit of an isolation resistance measuring apparatus having a fault self-diagnosing function according to an embodiment of the present disclosure.

FIG. 2 is a circuit diagram schematically showing an equivalent circuit of an isolation resistance measuring apparatus 100 having a fault self-diagnosing function according to an embodiment of the present disclosure.

Referring to FIG. 2, the isolation resistance measuring apparatus 100 having a fault self-diagnosing function according to the present disclosure includes a first isolation resistance measuring unit 110, a second isolation resistance measuring unit 120, a first switch SW1, a second switch SW2, a voltage detection unit 130 and a control unit 140.

The first switch SW1 selectively connects the first isolation resistance measuring unit 110 to a cathode terminal of the battery 10. The first switch SW1 turns on or off according to a control signal of the control unit 140. Therefore, the first isolation resistance measuring unit 110 is selectively connected to the cathode terminal of the battery 10 according to a control signal of the control unit 140. In this specification, the circuit formed by connecting the first isolation resistance measuring unit 110 to the cathode terminal of the battery 10 is called a first circuit for better understanding of the present disclosure. When the first circuit is formed, a voltage at the cathode terminal of the battery is applied to the first isolation resistance measuring unit 110.

The second switch SW2 selectively connects the second isolation resistance measuring unit 120 to an anode terminal of the battery 10. The second switch SW2 turns on or off according to a control signal of the control unit 140. Therefore, the second isolation resistance measuring unit 120 is selectively connected to the anode terminal of the battery 10 according to a control signal of the control unit 140. In this specification, the circuit formed by connecting the second isolation resistance measuring unit 120 to the anode terminal of the battery 10 is called a second circuit for better understanding of the present disclosure. When the second circuit is formed, a voltage at the anode terminal of the battery is applied to the second isolation resistance measuring unit 120.

Preferably, the second isolation resistance measuring unit 120 further includes a DC power applying unit DC. Therefore, when the second circuit is formed, a positive voltage may be applied to the second isolation resistance measuring unit 120, which ensures a voltage value other than 0 to be sensed by the voltage detection unit 130.

Preferably, the first and second isolation resistance measuring units 110, 120 include a plurality of resistor elements. A range of voltages applied to the plurality of resistor elements by the battery 10 may be set by arbitrarily selecting a resistance value of each of the plurality of resistor elements. A range of voltage sensed by the voltage detection unit 130 may be set to be 5V or below by suitably selecting a resistance value of the resistor element, as an example.

Even though FIG. 2 shows an example in which the first and second isolation resistance measuring units 110, 120 are configured with first and second resistors $R_1$, $R_2$, the present disclosure is not limited thereto. In addition, it should be understood that the example in FIG. 2 shows that first and second isolation resistance measuring units 110, 120 are identically configured with the first and second resistors $R_1$, $R_2$ for better understanding of the present disclosure and simple drawing. It is obvious to those skilled in the art that the number of resistor elements, a resistance value of each resistor element or the like may be set in various ways.

In addition, even though the first isolation resistance measuring unit 110 and the second isolation resistance measuring unit 120 are depicted as including only resistor elements, it should be understood that an existing electric component capable of receiving a voltage applied from the battery 10 and measuring a voltage may be added in addition to the resistor element or substituted for the resistor element.

The voltage detection unit 130 senses a detected isolation voltage applied to the first and second isolation resistance measuring units 110, 120. The detected isolation voltage is a voltage applied to the second resistor $R_2$. The detected isolation voltage is used for calculating an isolation resistance value of the battery 10. In this specification, when the first circuit is formed, a voltage applied to the second resistor $R_2$ included in the first isolation resistance measuring unit 110 is called a first detected isolation voltage $V_1$. In addition, when the second circuit is formed, a voltage applied to the second resistor $R_2$ included in the second isolation resistance measuring unit 120 is called a second detected isolation voltage $V_2$. The voltage detection unit 130 outputs signals corresponding to the first and second detected isolation voltages $V_1$, $V_2$ to the control unit 140.

The control unit 140 outputs a control signal to the first and second switches SW1, SW2 to turn on or off. When sending a control signal to the first switch SW1 to turn on, the control unit 140 controls the second switch SW2 to maintain a turn-off state. On the contrary, when sending a control signal to the second switch SW2 to turn on, the control unit 140 controls the first switch SW1 to maintain a turn-off state. By doing so, the control unit 140 allows the first and second isolation resistance measuring units 110, 120 to be connected to the cathode terminal and the anode terminal of the battery 10 at different time points. Meanwhile, the first and second switches SW1, SW2 are named to be distinguishable from each other and do not represent an order in which the control unit 140 outputs control signals or an order in which the isolation resistance measuring apparatus 100 operates.

The control unit 140 receives signals corresponding to first and second detected isolation voltages $V_1$, $V_2$ received from the voltage detection unit 130. In this case, the control unit 140 calculates an isolation resistance $R_{Leak(+)}$ of the cathode terminal and an isolation resistance $R_{Leak(-)}$ of the anode terminal from simultaneous circuit equations derived from the first and second detected isolation voltages $V_1$, $V_2$ and the first and second circuits. A calculating algorithm for the isolation resistance value using the simultaneous circuit equations will be described later in detail.

Meanwhile, the voltage of the battery 10 is expressed as $V_{Bat}$, and the isolation resistance $R_{Leak(+)}$ of the cathode terminal and the isolation resistance $R_{Leak(-)}$ of the anode terminal respectively displayed at the cathode and anode terminals of the battery 10 express virtual resistance values which represent an isolation state of the battery 10. Therefore, if the isolation state of the battery 10 is destroyed, the isolation resistance $R_{Leak(+)}$ of the cathode terminal and the isolation resistance $R_{Leak(-)}$ of the anode terminal are measured as low values, which can be interpreted that a leakage current has occurred.

Hereinafter, an algorithm to calculate the isolation resistance $R_{Leak(+)}$ of the cathode terminal and the isolation resistance $R_{Leak(-)}$ of the anode terminal of the isolation resistance measuring apparatus 100 having a fault self-diagnosing function according to the present disclosure will be described in detail with reference to FIGS. 3 and 4.

Figure 3:
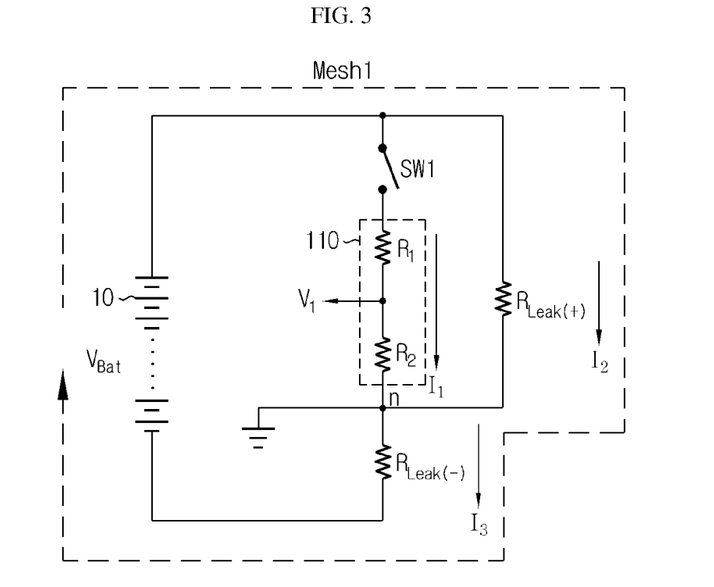
FIG. 3 is a circuit diagram schematically showing a first circuit according to an embodiment of the present disclosure.

FIG. 3 is a circuit diagram schematically showing the first circuit according to an embodiment of the present disclosure.

Referring to FIG. 3, a current flowing at the first isolation resistance measuring unit 110 is marked as $I_1$, a current flowing at the isolation resistance $R_{Leak(+)}$ of the cathode terminal is marked as $I_2$, and a current flowing at the isolation resistance $R_{Leak(-)}$ of the anode terminal is marked as $I_3$.

First, a value of the first detected isolation voltage $V_1$ may be expressed with $I_1$ as in Equation 1 below.

$$V_1 = I_1 R_2 \quad \text{Equation 1}$$

In addition, since the first isolation resistance measuring unit 110 is in parallel with the isolation resistance $R_{Leak(+)}$ of the cathode terminal, a relationship like Equation 2 below is established.

$$I_1 R_1 + V_1 = I_2 R_{Leak(+)} \quad \text{Equation 2}$$

Meanwhile, if Kirchhoff's current law is applied based on a node n connected to the ground, Equation 3 below is derived.

$$I_1 + I_2 = I_3 \quad \text{Equation 3}$$

If Equations 1 and 2 are put into Equation 3 and then arranged with respect to $I_3$, Equation 3 may be expressed like Equation 4 below.

$$I_3 = \frac{V_1}{R_2} + \frac{\left(\frac{V_1}{R_2}\right)R_1 + V_1}{R_{Leak(+)}} \quad \text{Equation 4}$$

Meanwhile, if Kirchhoff's voltage low is applied based on Mesh 1 shown in FIG. 3, an equation in the first line included in Equation 5 below is derived. In addition, if the equation in the first line is arranged using $I_2$ and $I_3$ obtained through Equations 1 to 4, an equation in the last line included in Equation 5 below may be induced.

$$V_{Bat} = I_2 R_{Leak(+)} + I_3 R_{Leak(-)} \quad \text{Equation 5}$$

$$V_{Bat} = \left(\frac{\left(\frac{V_1}{R_2}\right)R_1 + V_1}{R_{Leak(+)}}\right)R_{Leak(+)} + \left(\frac{V_1}{R_2} + \frac{\left(\frac{V_1}{R_2}\right)R_1 + V_1}{R_{Leak(+)}}\right)R_{Leak(-)}$$

$$V_{Bat} = \left(\frac{V_1}{R_2}\right)R_1 + V_1 + \left(\frac{V_1}{R_2} + \frac{\left(\frac{V_1}{R_2}\right)R_1 + V_1}{R_{Leak(+)}}\right)R_{Leak(-)}$$

The equation in the last line included in Equation 5 is one of simultaneous circuit equations for calculating the isolation resistance $R_{Leak(+)}$ of the cathode terminal and the isolation resistance $R_{Leak(-)}$ of the anode terminal and is used together with other circuit equations described below.

Figure 4:
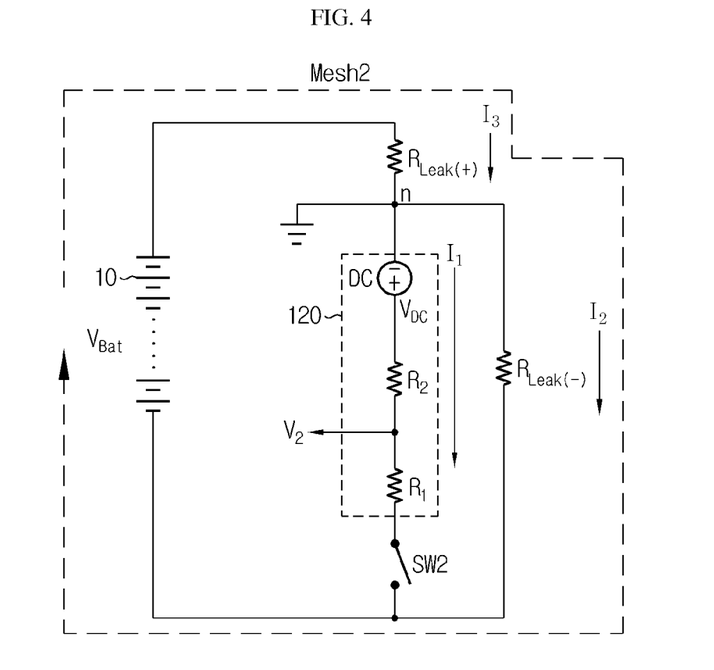
FIG. 4 is a circuit diagram schematically showing a second circuit according to an embodiment of the present disclosure.

FIG. 4 is a circuit diagram schematically showing the second circuit according to an embodiment of the present disclosure.

Referring to FIG. 4, a current flowing at the second isolation resistance measuring unit 120 is marked as $I_1$, a current flowing at the isolation resistance $R_{Leak(-)}$ of the anode terminal is marked as $I_2$, and a current flowing at the isolation resistance $R_{Leak(+)}$ of the cathode terminal is marked as $I_3$.

First, a value of the second detected isolation voltage $V_2$ is expressed with $I_1$ as in Equation 6 below.

$$V_2 = V_{DC} - I_1 R_2 \quad \text{Equation 6}$$

In addition, since the second isolation resistance measuring unit 120 is in parallel with the isolation resistance $R_{Leak(-)}$ of the anode terminal, a relationship as in Equation 7 below is established.

$$I_1 R_1 - V_2 = I_2 R_{Leak(-)} \quad \text{Equation 7}$$

Meanwhile, if Kirchhoff's current law is applied based on a node n connected to the ground, Equation 8 below is derived.

$$I_3 = I_1 + I_2 \quad \text{Equation 8}$$

If Equations 6 and 7 are put into Equation 8 and then arranged with respect to $I_3$, Equation 8 may be expressed like Equation 9 below.

$$I_3 = \frac{V_{DC} - V_2}{R_2} + \frac{\left(\frac{V_{DC} - V_2}{R_2}\right)R_1 - V_2}{R_{Leak(-)}} \quad \text{Equation 9}$$

Meanwhile, if Kirchhoff's voltage low is applied based on Mesh 2 shown in FIG. 4, an equation in the first line included in Equation 10 below is derived. In addition, if the equation in the first line is arranged using $I_2$ and $I_3$ obtained through Equations 6 to 9, an equation in the last line included in Equation 10 below may be induced.

$$V_{Bat} = I_2 R_{Leak(-)} + I_3 R_{Leak(+)}$$ Equation 10

$$V_{Bat} = \left( \frac{\left( \frac{V_{DC} - V_2}{R_2} \right) R_1 - V_2}{R_{Leak(-)}} \right) R_{Leak(-)} +$$

$$\left( \frac{V_{DC} - V_2}{R_2} + \frac{\left( \frac{V_{DC} - V_2}{R_2} \right) R_1 - V_2}{R_{Leak(-)}} \right) R_{Leak(+)}$$

$$V_{Bat} = \left( \frac{V_{DC} - V_2}{R_2} \right) R_1 - V_2 +$$

$$\left( \frac{V_{DC} - V_2}{R_2} + \frac{\left( \frac{V_{DC} - V_2}{R_2} \right) R_1 - V_2}{R_{Leak(-)}} \right) R_{Leak(+)}$$

The equation in the last line included in Equation 10 is other circuit equations among the simultaneous circuit equations for calculating the isolation resistance $R_{Leak(+)}$ of the cathode terminal and the isolation resistance $R_{Leak(-)}$ of the anode terminal. Therefore, if solutions for the isolation resistance $R_{Leak(+)}$ of the cathode terminal and the isolation resistance $R_{Leak(-)}$ of the anode terminal are obtained by simultaneously using the equation in the last line included in Equation 5 and the equation in the last line included in Equation 10, Equation 11 below may be obtained.

$$R_{Leak(+)} = \frac{(V_{Bat} - A)(V_{Bat} - C) - AC}{D(V_{Bat} - A) + BC}$$ Equation 11

$$R_{Leak(-)} = \frac{(V_{Bat} - A)(V_{Bat} - C) - AC}{B(V_{Bat} - A) + AD}$$

$$\therefore A = \left( \frac{V_1}{R_2} \right) R_1 + V_1$$

$$\therefore B = \frac{V_1}{R_2}$$

$$\therefore C = \left( \frac{V_{DC} - V_2}{R_2} \right) R_1 - V_2$$

$$\therefore D = \frac{V_{DC} - V_2}{R_2}$$

In Equation 11, the voltage value $V_{Bat}$ of the battery, the resistance values of the first and second resistors $R_1$, $R_2$ and the voltage value $V_{DC}$ of the DC power applying unit are already known, and the first and second detected isolation voltages $V_1$, $V_2$ may be obtained by means of the voltage detection unit 130. Therefore, the control unit 140 may quantitatively calculate the isolation resistance $R_{Leak(+)}$ of the cathode terminal and the isolation resistance $R_{Leak(-)}$ of the anode terminal of the battery 10 by putting the first and second detected isolation voltages $V_1$, $V_2$ received from the voltage detection unit 130 to Equation 11.

If the isolation resistance $R_{Leak(+)}$ of the cathode terminal and the isolation resistance $R_{Leak(-)}$ of the anode terminal of the battery 10 are respectively calculated, an electrode of the battery where an isolation breakdown occurs may be accurately figured out.

Heretofore, an algorithm for the isolation resistance measuring apparatus 100 having a fault self-diagnosing function according to the present disclosure to calculate an isolation resistance value has been described in brief. Hereinafter, a fault self-diagnosing algorithm of the isolation resistance measuring apparatus 100 having a fault self-diagnosing function according to the present disclosure will be described.

Figure 5:
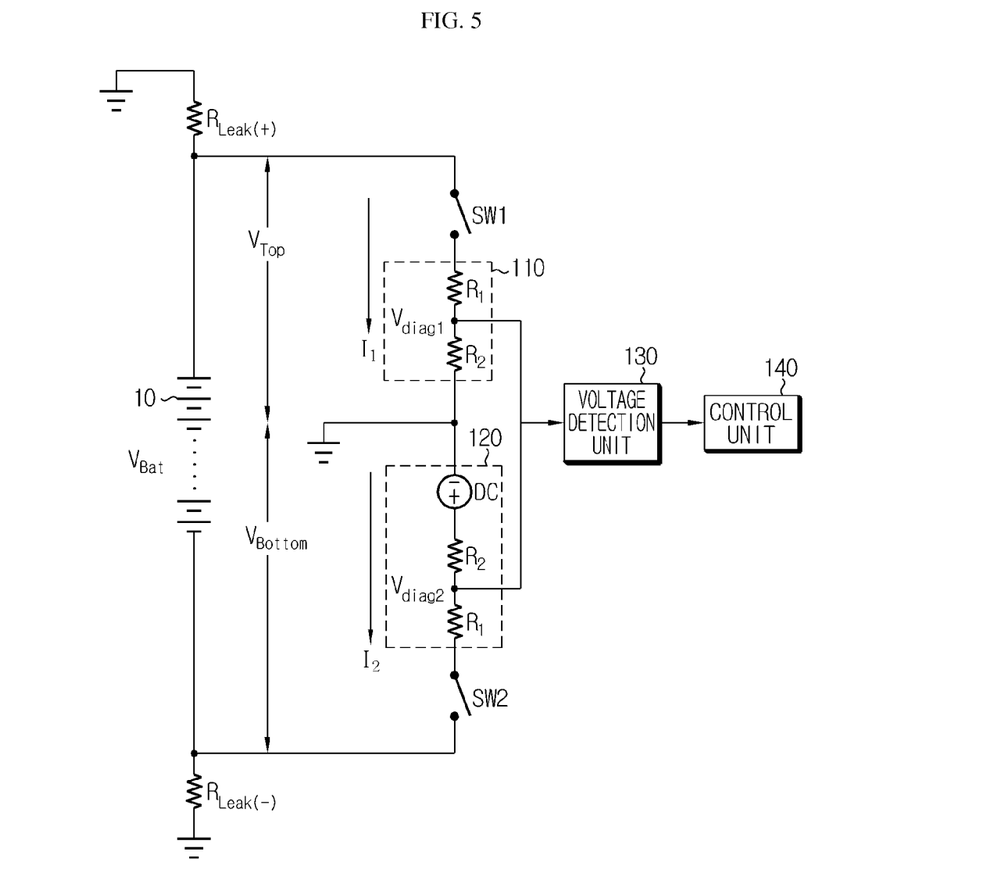
FIG. 5 is a circuit diagram schematically showing a diagnosis circuit according to an embodiment of the present disclosure.

FIG. 5 is a circuit diagram schematically showing a diagnosis circuit according to an embodiment of the present disclosure.

Referring to FIG. 5, it may be found that both the first and second isolation resistance measuring units 110, 120 are connected to the cathode terminal and the anode terminal of the battery 10.

The control unit 140 outputs control signals to both the first and second switches SW1, SW2 to turn on. When measuring isolation resistance, the control unit 140 connects the first and second isolation resistance measuring units 110, 120 to the cathode and anode terminals of the battery 10 at different time points. However, when diagnosing whether a fault arises, the control unit 140 connects the first and second isolation resistance measuring units 110, 120 to the cathode and anode terminals of the battery 10 at the same time point. Therefore, FIG. 5 shows that the first and second isolation resistance measuring units 110, 120 are simultaneously connected to the cathode and anode terminals of the battery 10 to form a diagnosis circuit.

The voltage detection unit 130 senses diagnosis voltages applied to the first and second isolation resistance measuring units 110, 120. The diagnosis voltage is a voltage applied to the second resistor $R_2$, similar to the detected isolation voltage described above. The diagnosis voltage is used for diagnosing whether a fault arises at the isolation resistance measuring apparatus 100 according to the present disclosure. In this specification, the voltage applied to the second resistor $R_2$ included in the first isolation resistance measuring unit 110 is called a first diagnosis voltage $V_{diag1}$. In addition, a voltage applied to the second resistor $R_2$ included in the second isolation resistance measuring unit 120 is called a second diagnosis voltage $V_{diag2}$. The voltage detection unit 130 outputs signals corresponding to the first and second diagnosis voltages $V_{diag1}$, $V_{diga2}$ to the control unit 140.

The control unit 140 determines whether a fault arises at the isolation resistance measuring apparatus by using a circuit equation derived from the diagnosis circuit and the first and second diagnosis voltages $V_{diag1}$, $V_{diag2}$. Hereinafter, an algorithm for diagnosing whether a fault arises at the isolation resistance measuring apparatus according to the present disclosure will be described in detail with reference to following equations and FIG. 5.

Referring to FIG. 5, a current flowing at the first isolation resistance measuring unit 110 is marked as $I_1$, and a current flowing at the second isolation resistance measuring unit 110 ($\rightarrow$120) is marked as $I_{12}$. In addition, a voltage between the cathode terminal of the battery and the ground is marked as $V_{Top}$, and a voltage between the anode terminal of the battery and the ground is marked as $V_{Bottom}$.

First, a value of the first diagnosis voltage $V_{diag1}$ may be expressed with $I_1$ as in Equation 12 below.

$$V_{diag1} = I_1 R_2$$ Equation 12

If Equation 12 is arranged with respect to $I_1$, Equation 13 below may be expressed.

$$I_1 = \frac{V_{diag1}}{R_2}$$ Equation 13

In addition, since the voltage $V_{Top}$ between the cathode terminal of the battery and the ground is a voltage applied to the first isolation resistance measuring unit 110, a relationship like Equation 14 below is established.

$$V_{Top} = V_{diag1} + I_1 R_1 \quad \text{Equation 14}$$

If $I_1$ arranged in Equation 13 is put into Equation 14, Equation 14 may be expressed like Equation 15 below.

$$V_{Top} = V_{diag1} + \frac{V_{diag1}}{R_2} R_1 \quad \text{Equation 15}$$

Meanwhile, a value of the second diagnosis voltage $V_{diag2}$ may be expressed with $I_2$ as in Equation 16 below.

$$V_{diag2} = V_{DC} - I_2 R_2 \quad \text{Equation 16}$$

If Equation 16 is arranged with respect to $I_2$, Equation 17 below may be expressed.

$$I_2 = \frac{V_{DC} - V_{diag2}}{R_2} \quad \text{Equation 17}$$

In addition, since the voltage $V_{Bottom}$ between the ground and the anode terminal of the battery is a voltage applied to the second isolation resistance measuring unit 120, a relationship like Equation 18 below is established.

$$V_{Bottom} = I_2 R_1 - V_{diag2} \quad \text{Equation 18}$$

If $I_2$ arranged in Equation 17 is put into Equation 18, Equation 18 may be expressed like Equation 19 below.

$$V_{Bottom} = \left( \frac{V_{DC} - V_{diag2}}{R_2} \right) R_1 - V_{diag2} \quad \text{Equation 19}$$

Finally, since the voltage $V_{Bat}$ of the battery is expressed as the sum of $V_{Top}$ and $V_{Bottom}$, an equation in the first line included in Equation 20 below is derived. In addition, if the equation in the first line is arranged using $V_{Top}$ and $V_{Bottom}$ obtained through Equations 15 and 19, an equation in the last line included in Equation 20 below may be induced.

$$V_{Top} + V_{Bottom} = V_{Bat} \quad \text{Equation 20}$$
$$\left( \frac{V_{diag1}}{R_2} \right) R_1 + V_{diag1} + \left( \frac{V_{DC} - V_{diag2}}{R_2} \right) R_1 - V_{diag2} = V_{Bat}$$

The equation in the last line included in Equation 20 is a circuit equation for diagnosing whether a fault arises at the isolation resistance measuring apparatus. In Equation 20, the voltage value $V_{Bat}$ of the battery, the resistance values of the first and second resistors $R_1$, $R_2$ and the voltage value $V_{DC}$ of the DC power applying unit are already known, and the first and second diagnosis voltages $V_{diag1}$, $V_{diag2}$ may be obtained by means of the voltage detection unit 130. Here, the voltage value $V_{Bat}$ of the battery may be a value measured using the voltage detection unit 130. Therefore, in the case the circuit equation is satisfied, if a fault does not arise at the isolation resistance measuring apparatus, the calculated isolation resistance value is reliable.

According to another embodiment of the present disclosure, the control unit 140 determines whether a fault arises by checking whether a value calculated from Equation 20 falls within an error range preset based on the voltage value $V_{Bat}$ of the battery. Due to errors such as a measurement error which may occur during a process of detecting the first and second diagnosis voltages $V_{diag1}$, $V_{diag2}$, an error of the voltage value $V_{Bat}$ of the battery, deletion of values other than effective values below the decimal point during a calculating process using the equations, or the like, which may occur when an actual apparatus is implemented, it will be difficult to perfectly satisfy the diagnosis circuit equation. Therefore, by considering such potential errors, an error range is set in advance based on the voltage value $V_{Bat}$ of the battery, and then it will be reliable whether a fault arises at the isolation resistance measuring apparatus if the value calculated from Equation 20 falls within the error range. Preferably, the error range may be set to determine that a fault arises when the value calculated from Equation 20 is different by 1% or more based on the voltage value of the battery.

Figure 6:
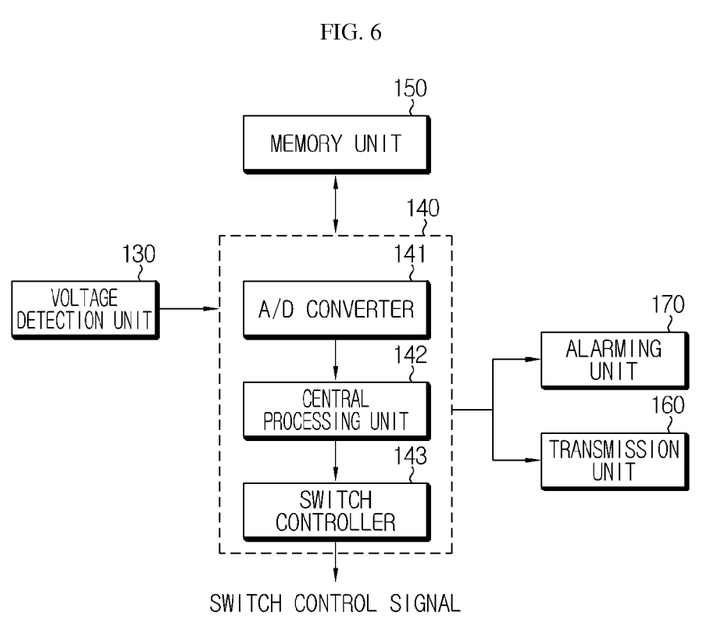
FIG. 6 is a block diagram showing a control unit according to an embodiment of the present disclosure.

In order to execute the diagnosing algorithm described above, the control unit 140 may include a switch controller 143, an A/D converter 141 and a central processing unit 142.

FIG. 6 is a block diagram showing a control unit 140 according to an embodiment of the present disclosure.

Referring to FIG. 6, the switch controller 143 outputs switch control signals to control the first and second switches SW1, SW2 to turn on or off. In addition, the control unit 140 receives a voltage measurement signal from the voltage detection unit 130. At this time, the A/D converter 141 converts an analog voltage signal output from the voltage detection unit 130 into a digital voltage signal. In addition, the central processing unit 142 receives the digital voltage signal from the A/D converter 141 and determines whether a fault arises at the isolation resistance measuring apparatus 100.

The control unit 140 or the central processing unit 142 may include processors known in the art, an application-specific integrated circuit (ASIC), other chipsets, logic circuits, registers, communication modems, data processors or the like in order to execute various control logics described above. In addition, when the control logics described above are implemented with software, the control unit 140 or the central processing unit 142 may be implemented as a group of program modules. At this time, the program modules may be stored in a memory and executed by a processor.

Preferably, the isolation resistance measuring apparatus 100 having a fault self-diagnosing function according to the present disclosure further includes a memory unit 150 which stores the battery voltage value $V_{Bat}$, the voltage value $V_{DC}$ of the DC power applying unit, the first resistance value $R_1$ and the second resistance value $R_2$. The memory unit 150 may be provided in or out of the control unit 140 and connected to the control unit 140 through a device well known in the art. The memory unit 150 is a mass storage medium such as a semiconductor device or a hard disk, which are known as being capable of recording or eliminating data, like RAM, ROM, EEPROM or the like, and is a generic term calling devices which store information, regardless of their kinds. Without being limited to a specific memory device.

According to another aspect of the present disclosure, the isolation resistance measuring apparatus 100 having a fault self-diagnosing function according to the present disclosure further includes a transmission unit 160 for forming a communication interface with an external device. In this case, the control unit 140 may transmit information about whether a fault arises at the isolation resistance measuring apparatus 100 to the external device by means of the transmission unit 160. The external device may be a battery analyzing device or a control device of a system on which a battery is loaded.

According to another aspect of the present disclosure, the isolation resistance measuring apparatus 100 having a fault self-diagnosing function according to the present disclosure further includes an alarming unit 170 for outputting a visual or audio alarming signal. In this case, if a fault arises at the isolation resistance measuring apparatus 100, the control unit 140 may output a visual or audio alarming signal by means of the alarming unit 170. When a fault arises, the alarming unit 170 may notify the fault occurrence to a user so that the user may take necessary measures.

For example, the alarming unit 170 may include an LED, an LCD, an alarm, or their combinations. In this case, the alarming unit 170 may notify the fault occurrence by blinking the LED, outputting a warning message at the LCD, or generating an alarm. In addition, the alarming unit 170 may be included in an external device connected to the transmission unit 160. However, the present disclosure is not limited thereto. Moreover, the LED, the LCD and the alarm are just examples of the alarming unit 170, and it is apparent to those skilled in the art that various modified visual or audio alarming devices may be used as the alarming unit 170.

Hereinafter, a fault self-diagnosing method of the isolation resistance measuring apparatus, which corresponds to an operating mechanism of the apparatus, will be described. However, the configuration of the isolation resistance measuring apparatus 100 having a fault self-diagnosing function is not described again here.

Figure 7:
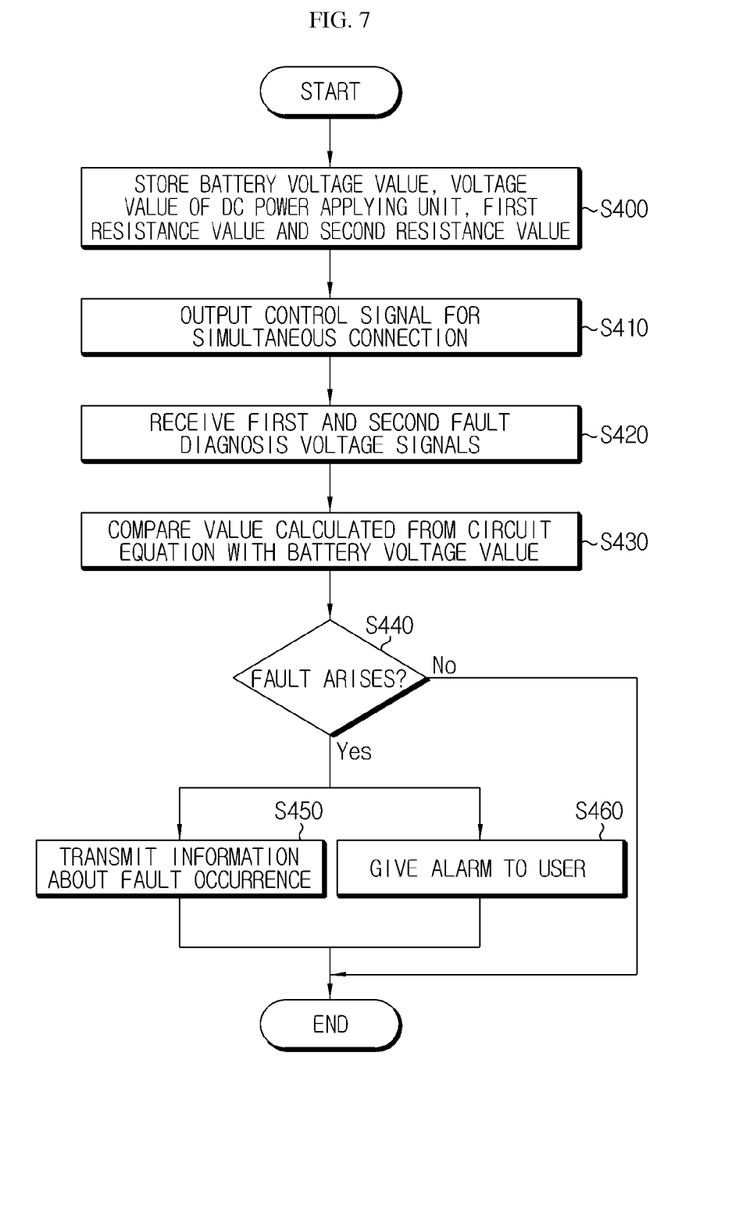
FIG. 7 is a flowchart for illustrating a fault self-diagnosing method using the isolation resistance measuring apparatus according to an embodiment of the present disclosure.

FIG. 7 is a flowchart for illustrating a fault self-diagnosing method using the isolation resistance measuring apparatus according to an embodiment of the present disclosure.

First, in Step S400, the battery voltage value $V_{Bat}$, the voltage value $V_{DC}$ of the DC power applying unit, the first resistance value $R_1$ and the second resistance value $R_2$ are stored in the memory unit 150. The stored values are put into Equation 20 together with detected isolation voltages and used for diagnosing whether a fault arises at the isolation resistance measuring apparatus. Here, the battery voltage value $V_{Bat}$ may be a value measured by using a separate voltage detection circuit (noise).

Next, in Step S410, the control unit 140 outputs control signals to both the first and second switches SW1, SW2 to turn on. In this step, the first and second isolation resistance measuring units 110, 120 are connected to the cathode and anode terminals of the battery 10 at the same time point. By doing so, a diagnosis circuit is formed.

Next, in Step S420, a signal corresponding to the voltage applied to each second resistor $R_2$, namely to the first and second diagnosis voltages $V_{diag1}$, $V_{diag2}$, is received from the voltage detection unit 130.

Next, in Step S430, the control unit 140 puts the first and second diagnosis voltages $V_{diag1}$, $V_{diag2}$ received in Step S420 to a circuit equation derived from the diagnosis circuit, and compares the value calculated from the equation with the battery voltage value $V_{Bat}$. The process for inducing an equation from the diagnosis circuit and the algorithm for diagnosing whether a fault arises have been described in detail and are not described in detail here. In addition, in Step S440, it is determined whether a fault arises at the isolation resistance measuring apparatus 100.

Preferably, if a fault arises at the isolation resistance measuring apparatus 100 (YES in Step S440), the process moves to Step S450 to transmit information about the fault occurrence to an external device or moves to Step S460 to give an alarm to a user.

According to the present disclosure, it is possible to diagnose whether a fault arises at an isolation resistance measuring apparatus of a battery. In addition, it is possible to diagnose a fault by using an original configuration, namely without adding any further component to the isolation resistance measuring apparatus of a battery. Moreover, it is possible to notify the fault occurrence to a user or an external device, which enables the user to take necessary measures.

Meanwhile, in the present disclosure, components employed in the isolation resistance measuring apparatus having a fault self-diagnosing function according to the present disclosure as shown in FIGS. 1 to 6 should be understood as logically distinguishable components, rather than physically distinguishable components.

In other words, in the present disclosure, each component corresponds to a logic component for implementing the technical spirit of the present disclosure. Therefore, even though components are integrated or divided, such integrated or divided components should be regarded as being within the scope of the present disclosure if the function of the logic configuration of the present disclosure is implemented. In addition, if a component performs a similar or identical function, the component should be regarded as being within the scope of the present disclosure regardless of its term.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. An isolation resistance measuring apparatus having a fault self-diagnosing function, the apparatus comprising:
    a first isolation resistance measuring unit and a second isolation resistance measuring unit respectively connected to a cathode terminal and an anode terminal of a battery;
    a first switch and a second switch for connecting the first isolation resistance measuring unit and the second isolation resistance measuring unit to the cathode terminal and the anode terminal, respectively;
    a voltage detection unit for sensing first and second diagnosis voltages by means of the first and second isolation resistance measuring units; and
    a control unit for outputting control signals to the first and second switches to form a diagnosis circuit, the control unit determining whether a fault arises at the isolation resistance measuring apparatus by using a circuit equation derived from the diagnosis circuit and the first and second diagnosis voltages received from the voltage detection unit when the diagnosis circuit is formed,
    wherein the second isolation resistance measuring unit further includes a DC power applying unit, and
    wherein the control unit determines whether a fault arises at the isolation resistance measuring apparatus, by checking whether the following equation is valid when the first and second diagnosis voltages are put therein:

$$\left(\frac{V_{diag1}}{R_2}\right)R_1 + V_{diag1} + \left(\frac{V_{DC} - V_{diag2}}{R_2}\right)R_1 - V_{diag2} = V_{Bat}$$

where $V_{Bat}$ represents a batter voltage value, $V_{diag1}$ represents a first diagnosis voltage, $V_{diag2}$ represents a second diagnosis voltage $V_{Dc}$ represents a voltage value of the DC power applying unit, $R_1$ represents a first resistance value, and $R_2$ represents a second resistance value.

2. The isolation resistance measuring apparatus having a fault self-diagnosing function according to claim 1, wherein the control unit determines whether a fault arises, by checking whether a value calculated from the equation falls within an error range preset based on the voltage value of the battery.

3. The isolation resistance measuring apparatus having a fault self-diagnosing function according to claim 2, wherein the control unit determines that a fault arises when the value calculated from the equation is different by 1% or more based on the voltage value of the battery.

4. The isolation resistance measuring apparatus having a fault self-diagnosing function according to claim 1, further comprising a memory unit which stores the battery voltage value, the voltage value of the DC power applying unit, the first resistance value and the second resistance value.

5. The isolation resistance measuring apparatus having a fault self-diagnosing function according to claim 1, wherein the control unit includes:
   a switch controller for outputting a signal for controlling the first and second switches to turn on or off;
   an A/D converter for converting an analog voltage signal output from the voltage detection unit into a digital voltage signal; and
   a central processing unit for receiving the digital voltage signal from the A/D converter and determining whether a fault arises at the isolation resistance measuring apparatus.

6. The isolation resistance measuring apparatus having a fault self-diagnosing function according to claim 1, further comprising a transmission unit for forming a communication interface with an external device,
   wherein the control unit transmits information about whether a fault arises at the isolation resistance measuring apparatus to the external device by means of the transmission unit.

7. The isolation resistance measuring apparatus having a fault self-diagnosing function according to claim 6,
   wherein the external device is a battery analyzing device or a control device of a system on which a battery is loaded.

8. The isolation resistance measuring apparatus having a fault self-diagnosing function according to claim 1, further comprising an alarming unit for outputting a visual or audio alarming signal,
   wherein the control unit outputs a visual or audio alarming signal by means of the alarming unit when it is determined that a fault arises at the isolation resistance measuring apparatus.

9. A fault self-diagnosing method of an isolation resistance measuring apparatus, which connects first and second isolation resistance measuring units to cathode and anode terminals of a battery, respectively, by using a first switch and a second switch and diagnoses whether a fault arises at the isolation resistance measuring apparatus by using first and second diagnosis voltages detected by the first and second isolation resistance measuring units, the method comprising:

(a) outputting control signals to the first switch and second switch to form a diagnosis circuit;
(b) receiving first and second diagnosis voltages detected by the first and second isolation resistance measuring units; and
(c) determining whether a fault arises at the isolation resistance measuring apparatus by using a circuit equation derived from the diagnosis circuit and the first and second diagnosis voltages,
wherein the second isolation resistance measuring unit further includes a DC power applying unit, and
wherein the step (c) determines whether a fault arises at the isolation resistance measuring apparatus, by checking whether the following equation is valid when the first and second diagnosis voltages are put therein:

$$\left(\frac{V_{diag1}}{R_2}\right)R_1 + V_{diag1} + \left(\frac{V_{DC} - V_{diag2}}{R_2}\right)R_1 - V_{diag2} = V_{Bat}$$

where $V_{Bat}$ represents a batter voltage value, $V_{diag1}$ represents a first diagnosis voltage, $V_{diag2}$ represents a second diagnosis voltage, $V_{Dc}$ represents a voltage value of the DC power applying unit, $R_1$ represents a first resistance value, and $R_2$ represents a second resistance value.

10. The fault self-diagnosing method of an isolation resistance measuring apparatus according to claim 9,
   wherein the step (c) determines whether a fault arises, by checking whether a value calculated from the equation falls within an error range preset based on the voltage value of the battery.

11. The fault self-diagnosing method of an isolation resistance measuring apparatus according to claim 10,
   wherein the step (c) determines that a fault arises when the value calculated from the equation is different by 1% or more based on the voltage value of the battery.

12. The fault self-diagnosing method of an isolation resistance measuring apparatus according to claim 9, further comprising:
   storing the battery voltage value, the voltage value of the DC power applying unit, the first resistance value and the second resistance value.

13. The fault self-diagnosing method of an isolation resistance measuring apparatus according to claim 9, further comprising:
   transmitting information about whether a fault arises at the isolation resistance measuring apparatus to an external device.

14. The fault self-diagnosing method of an isolation resistance measuring apparatus according to claim 9, further comprising:
   outputting a visual or audio alarming signal to a user when it is determined in the step (c) that a fault arises at the isolation resistance measuring apparatus.

* * * * *